US010354900B2

(12) United States Patent
Yazawa et al.

(10) Patent No.: US 10,354,900 B2
(45) Date of Patent: Jul. 16, 2019

(54) SUBSTRATE TRANSFER APPARATUS AND SUBSTRATE TRANSFER METHOD

(71) Applicant: Ebara Corporation, Tokyo (JP)

(72) Inventors: Akihiro Yazawa, Tokyo (JP); Kenichi Kobayashi, Tokyo (JP); Takahiro Nanjo, Tokyo (JP); Hiroyuki Takenaka, Tokyo (JP)

(73) Assignee: Ebara Corporation, Tokyo (JP)

( * ) Notice: Subject to any disclaimer, the term of this patent is extended or adjusted under 35 U.S.C. 154(b) by 240 days.

(21) Appl. No.: 15/356,869

(22) Filed: Nov. 21, 2016

(65) Prior Publication Data

US 2017/0178940 A1  Jun. 22, 2017

(30) Foreign Application Priority Data

Dec. 18, 2015  (JP) ................................ 2015-246850

(51) Int. Cl.
*H01L 21/677*  (2006.01)
*H01L 21/67*  (2006.01)
*H01L 21/687*  (2006.01)

(52) U.S. Cl.
CPC .. *H01L 21/67742* (2013.01); *H01L 21/67173* (2013.01); *H01L 21/67219* (2013.01); *H01L 21/67259* (2013.01); *H01L 21/68707* (2013.01)

(58) Field of Classification Search
CPC combination set(s) only.
See application file for complete search history.

(56) References Cited

U.S. PATENT DOCUMENTS

| 5,671,962 A | * | 9/1997 | Otsuka | B25J 9/1612 294/119.1 |
|---|---|---|---|---|
| 2004/0261944 A1 | * | 12/2004 | Wakabayashi | B24B 37/345 156/345.12 |
| 2009/0093192 A1 | * | 4/2009 | Takahashi | B24B 9/065 451/6 |
| 2014/0028118 A1 | * | 1/2014 | Sakano | H02K 7/00 310/12.14 |
| 2014/0320867 A1 | * | 10/2014 | Kanno | B24B 37/013 356/630 |

FOREIGN PATENT DOCUMENTS

| JP | 10-321704 A | 12/1998 | |
| JP | 2006-303112 A | 11/2006 | |
| NL | 102010 C2 * | 9/2005 | B66C 23/02 |

OTHER PUBLICATIONS

Smit "English translation for reference NL1026010C2", Sep. 2005.*

* cited by examiner

*Primary Examiner* — Rachid Bendidi
(74) *Attorney, Agent, or Firm* — Abelman, Frayne & Schwab

(57) ABSTRACT

Disclosed is a substrate transfer apparatus including: a pair of hands facing with each other; an opening/closing mechanism configured to move the pair of hands symmetrically in an opening/closing direction; a driving unit configured to transmit a power to the opening/closing mechanism; and a controller configured to control an operation of the driving unit. The opening/closing mechanism includes: a rotating body configured to rotate depending on a moving amount of the pair of hands in the opening/closing direction, and a sensor configured to detect a rotating amount of the rotating body. The controller controls an operation of the driving unit based on a signal from the sensor.

18 Claims, 9 Drawing Sheets

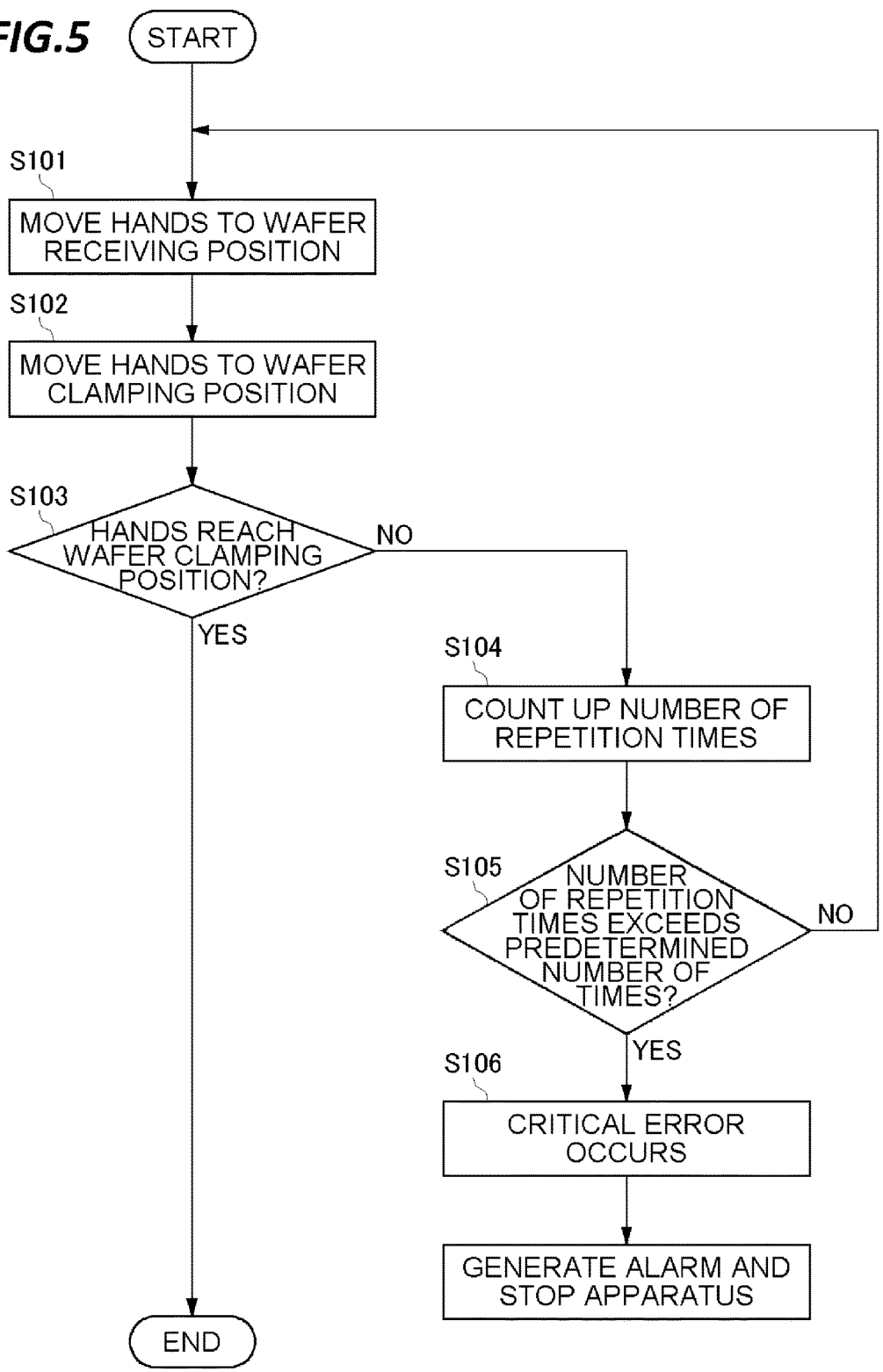

SUBSTRATE TRANSFER APPARATUS AND SUBSTRATE TRANSFER METHOD

CROSS-REFERENCE TO RELATED APPLICATIONS

This application is based on and claims priority from Japanese Patent Application No. 2015-246850, filed on Dec. 18, 2015, with the Japan Patent Office, the disclosure of which is incorporated herein in its entirety by reference.

TECHNICAL FIELD

The present disclosure relates to a substrate transfer apparatus and a substrate transfer method.

BACKGROUND

In a semiconductor manufacturing process in which various treatments such as, for example, a film formation, are performed on a substrate to be processed (e.g., a semiconductor wafer) in order to form a plurality of semiconductor elements on a surface of the substrate to be processed, a substrate transfer apparatus is used to transfer the substrate to be processed. For example, in a batch type semiconductor manufacturing process, there is a case where a plurality of substrates is transferred at once by a substrate transfer apparatus that is provided with a plurality of substrate carrying plates (see, e.g., FIGS. 16 to 20 in Japanese Patent Laid-Open Publication No. 10-321704). In addition, in a single substrate type semiconductor manufacturing process, there is a case where substrates are transferred one by one by a substrate transfer apparatus (see, e.g., FIG. 21 in Japanese Patent Laid-Open Publication No. 10-321704).

Recently, as the miniaturization and high integration of semiconductor devices have advanced, a problem has been caused by foreign matters generated, for example, on a bevel portion and an edge portion of a semiconductor wafer (substrate) during a manufacturing process of the semiconductor devices. In an effort to remove the foreign matters, a bevel polishing process has been proposed in which the peripheral edge of the substrate is polished using a polishing tape having a surface to which fixed abrasive grains are attached. In the bevel polishing process, in order to remove foreign matters formed on the peripheral edge of the substrate, the polishing tape comes in slide contact with the peripheral edge of the substrate while the substrate is being rotated, thereby removing the foreign matters. For that reason, it is required to accurately position the center of the substrate to be processed at the axial center of a rotary table (stage). Japanese Patent Laid-Open Publication No. 2006-303112 discloses a substrate transfer apparatus to be used in the bevel polishing process.

SUMMARY

A substrate transfer apparatus according to the present disclosure includes: a pair of hands facing each other; an opening/closing mechanism configured to move the pair of hands symmetrically toward or away from each other in an opening/closing direction; a driving unit configured to transmit a power to the opening/closing mechanism; and a controller configured to control the operation of the driving unit. The opening/closing mechanism includes: a rotating body configured to rotate according to a moving amount of the pair of hands in the opening/closing direction, and a sensor configured to detect a rotating amount of the rotating body. The controller controls an operation of the driving unit based on a signal from the sensor.

The foregoing summary is illustrative only and is not intended to be in any way limiting. In addition to the illustrative aspects, embodiments, and the features described above, further aspects, embodiments, and features will become apparent by reference to the drawings and the following detailed description.

BRIEF DESCRIPTION OF THE DRAWINGS

FIG. 5 is a flowchart for describing a retry operation;

DETAILED DESCRIPTION

Figure 1:
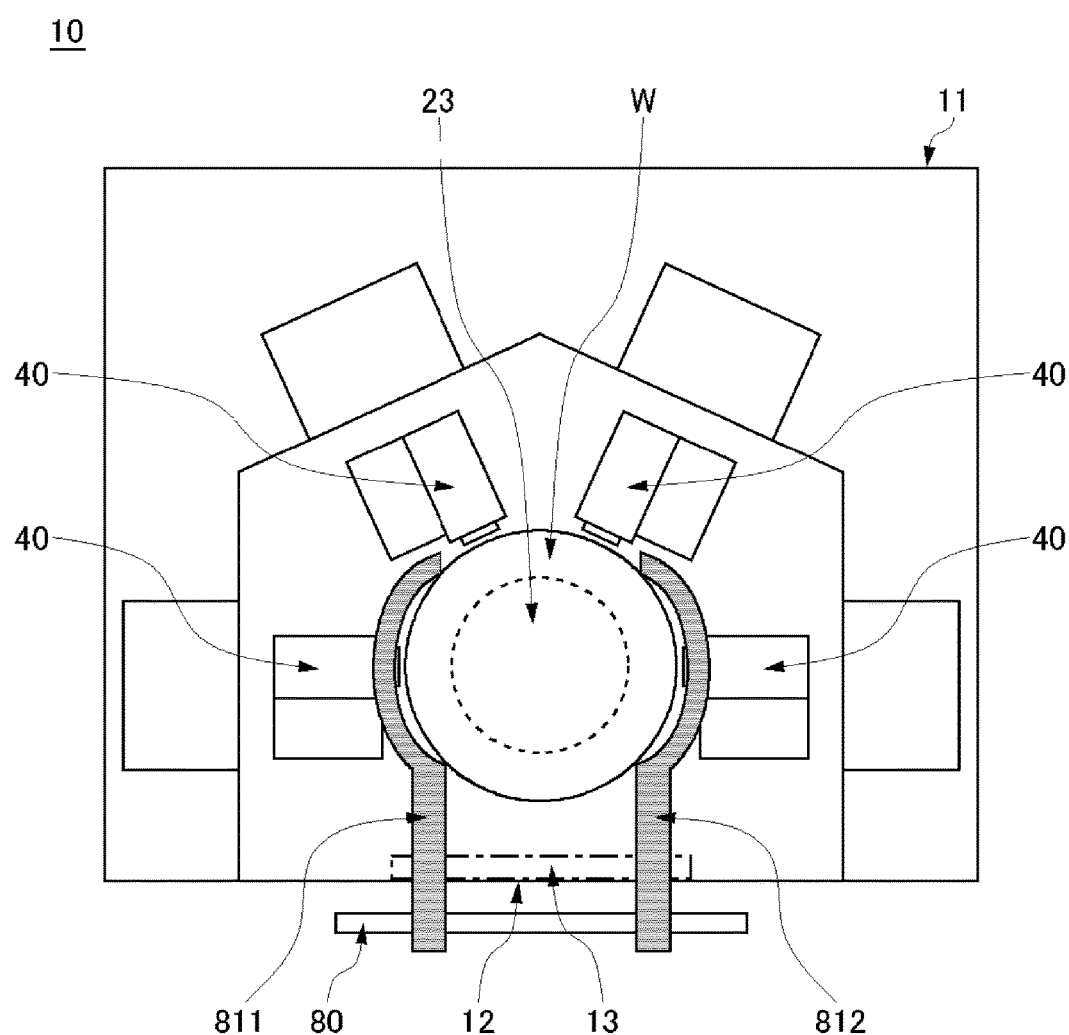
FIG. 1 is a plan view illustrating a bevel polishing apparatus according to an exemplary embodiment of the present disclosure.

In the following detailed description, reference will be made to the accompanying drawings, which form a part hereof. The exemplary embodiments described in the detailed description, drawings, and claims are not meant to be limiting. Other embodiments may be utilized, and other changes may be made without departing from the spirit or scope of the subject matter presented here.

The substrate transfer apparatus in the related art disclosed in, for example, Japanese Patent Laid-Open Publication No. 2006-303112 adopts a servo motor as a driving mechanism that is complicated and expensive. The central position during a wafer clamping becomes a constant position that is adjusted based on a reference wafer.

Meanwhile, when a wafer is considered to have a wafer diameter of, for example, 300 mm by the SEMI standard, the wafer is commonly available as a 300 mm wafer within the range of ±0.2 mm on the standard. Thus, the wafer diameter may vary up to 400 μm. In a bevel polishing apparatus that the inventors of the present disclosure have intended to propose, a positional accuracy in removing foreign matters from the bevel portion and the edge portion of a semiconductor wafer (substrate) has been assumed as tens of micrometers. However, in the conventional device, it has been found out that it may be difficult to follow the variation in a wafer diameter when the central position is constant during the wafer clamping.

The present disclosure has been made in order to effectively solve the problems as described above. An object of the present disclosure is to provide a substrate transfer apparatus that is capable of positioning the center of a wafer at the axial center of a stage with high accuracy when the wafer is delivered to the stage.

A substrate transfer apparatus according to the present disclosure includes: a pair of hands facing each other; an opening/closing mechanism configured to move the pair of hands symmetrically toward or away from each other in an opening/closing direction; a driving unit configured to transmit a power to the opening/closing mechanism; and a controller configured to control the operation of the driving unit. The opening/closing mechanism includes a rotating body configured to rotate depending on a moving amount of the pair of hands in the opening/closing direction, and a sensor configured to detect a rotating amount of the rotating body. The controller controls the operation of the driving unit based on a signal from the sensor.

According to the substrate transfer apparatus of the present disclosure, the moving amount of a pair of hands in the opening/closing direction is detected by being converted into a rotating amount (rotating angle) of the rotating body. As a result, the moving amount may be detected with high accuracy even if the moving amount is very small. This enables to cope with a movement at a very small stroke of a pair of hands such that even if there is a change in a wafer diameter, the center of the wafer may be precisely positioned at the axial center of the stage.

In the substrate transfer apparatus according to the present disclosure, the opening/closing mechanism may include a pair of gears and an annular belt wound around the gears, and the annular belt may extend to form two parallel linear portions between the gears. One of the pair of hands may be attached to one of the linear portions of the annular belt, and the other hand may be attached to the other of the linear portions of the annular belt.

According to this aspect, because the annular belt fits in the state of being engaged with the pair of gears by the tension thereof, the high positional precision may readily be managed as compared to a case where the opening/closing mechanism is constituted only with a rigid body.

In the substrate transfer apparatus according to the present disclosure, the rotating body may be constituted with one of the gears.

According to this aspect, the number and costs of components are reduced.

In the substrate transfer apparatus according to the present disclosure, the rotating body may be a separate component from the gears.

According to this aspect, a sensor may be readily installed even if the space around the gears is narrow.

In the substrate transfer apparatus according to the present disclosure, the driving unit may include a pneumatic actuator.

According to this aspect, the clamping pressure is readily adjusted during the clamping of the wafer, and the driving unit is relatively inexpensive.

In the substrate transfer apparatus according to the present disclosure, the controller may be configured to: control the operation of the driving unit such that the pair of hands move from a wafer receiving position to a wafer clamping position; determine whether the pair of hands reach the wafer clamping position based on a signal from the sensor; and, when it is determined that the pair of hands do not reach the wafer clamping position, repeat a retry operation of controlling the operation of the driving unit such that the pair of hands move from the wafer receiving position to the wafer clamping position after the pair of hands returns to the wafer receiving position, by a predetermined number of times as an upper limit until the pair of hands reach the wafer clamping position.

According to this aspect, even if an accidental error occurs during the clamping, it is possible to correct the error by the retry operation. This reduces the number of times of stopping the substrate transfer apparatus such that the operating rate of the apparatus is improved.

In the substrate transfer apparatus according to the present disclosure, the sensor may be a dog-type sensor.

According to this aspect, the structure of the sensor is simplified and the sensor becomes inexpensive.

A substrate transfer apparatus according to the present disclosure includes: a pair of hands facing each other; an opening/closing mechanism configured to move the pair of hands toward or away from each other by the same distance in an opening/closing direction; a driving unit configured to transmit a power to the opening/closing mechanism; and a controller configured to: control an operation of the driving unit such that the pair of hands move from a wafer receiving position to a wafer clamping position when receiving a substrate; determine whether the pair of hands reach the wafer clamping position; and when it is determined that the pair of hands do not reach the wafer clamping position, control the operation of the driving unit to repeat a retry operation by a predetermined number of times as an upper limit until the pair of hands reach the wafer clamping position.

An apparatus for manufacturing a semiconductor device according to the present disclosure includes a substrate transfer apparatus including any one of the above-described features.

A bevel polishing apparatus according to the present disclosure may include a substrate transfer apparatus including any one of the above-described features.

A substrate transfer method according to the present disclosure includes: providing a substrate; causing a pair of hands, which is located at a first position and faces each other, to move toward each other from opposite sides of the substrate by a same distance; determining whether the pair of hands reach a second position to grasp the substrate based on a signal from a sensor that measures a moving amount of the pair of hands; when it is determined that the pair of hands do not reach the second position to grasp the substrate, performing a retry operation of returning the pair of hands to the first position and then determining, based on a signal from the sensor that measures a moving amount of the hands, whether the pair of hands reach the second position to grasp the substrate while causing the pair of hands to move toward each other by a same distance; repeating the retry operation until it is determined that the pair of hands reach the second position to grasp the substrate by the retry, or until a number of times of performing the retry reaches a predetermined number of times; and transferring the substrate to a subsequent stage when it is determined that the pair of hands reach the second position to grasp the substrate.

A bevel polishing method according to the present disclosure includes: transferring a substrate from a substrate transfer apparatus to a wafer stage by the substrate transfer method having the above-mentioned features; polishing a bevel portion of the substrate; delivering the polished substrate on the wafer stage to a carrying device through the substrate transfer apparatus; and cleaning the substrate carried to a cleaning unit by the carrying device.

A recording medium according to the present disclosure is a non-transitory computer-readable recording medium storing a computer executable program that, when executed, causes a computer to control a substrate transfer method with a substrate transfer apparatus. The substrate transfer method may include: causing a pair of hands, which is located at a first position and faces each other, to move toward each other from opposite sides of the substrate by a same distance; determining whether the pair of hands reach a second position to grasp the substrate based on a signal from a sensor that measures a moving amount of the hands; when it is determined that the pair of hands do not reach the second position to grasp the substrate, performing a retry operation of returning the pair of hands to the first position and then determining, based on a signal from the sensor that measures a moving amount of the hands, whether the hands reach the second position to grasp the substrate while causing the pair of hands to move toward each other by a same distance; repeating the retry operation until it is determined that the pair of hands reach the second position to grasp the substrate by the retry, or until a number of times of performing the retry reaches a predetermined number of times; and transferring the substrate when it is determined that the pair of hands reach the second position to grasp the substrate.

According to the present disclosure, the center of the wafer may be positioned at the axial center of the stage with high accuracy.

Hereinafter, regarding the semiconductor device manufacturing apparatus including a substrate transfer apparatus of the present disclosure, a bevel polishing apparatus will be described as an example with reference to the accompanying drawings. Meanwhile, the exemplary embodiment to be described below represents an example in which the present disclosure is carried out, and the present disclosure is not limited by a specific configuration to be described below. In carrying out the present disclosure, a specific configuration according to an exemplary embodiment may be properly adopted.

Figure 7:
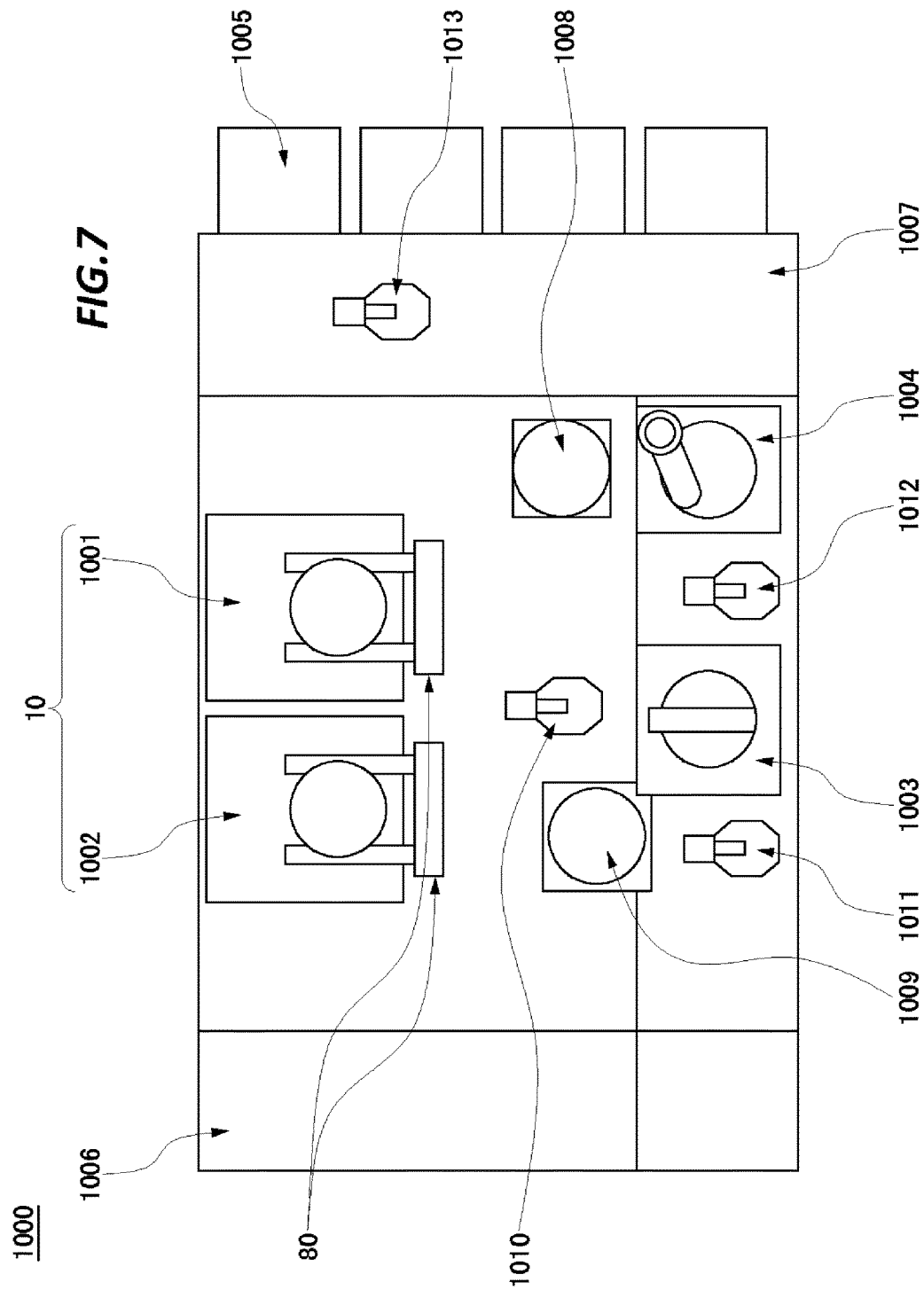
FIG. 7 is a plan view illustrating a bevel polishing system.

FIG. 7 is a plan view illustrating a bevel polishing system including a bevel polishing apparatus according to an exemplary embodiment of the present disclosure. As illustrated in FIG. 7, a bevel polishing system 1000 includes a front opening unified pod (FOUP) 1005 which is a load port, an equipment front end module (EFEM) 1007, a plurality of bevel polishing apparatuses 10 (which may also be referred to as first and second polishing sections 1001 and 1002 below), a cleaning unit 1003, a dryer 1004, a plurality of wafer temporary-mounting tables 1008 and 1009, and a plurality of carrying devices 1010 to 1013, and a controller 1006.

In the configuration of the bevel polishing system 1000 as illustrated in FIG. 7, a wafer W is processed in the following order. That is, the wafer W is placed on the wafer temporary-mounting table 1008 from the FOUP 1005 through the carrying device 1013 within the EFEM 1007. Subsequently, the wafer W on the wafer temporary-mounting table 1008 is carried into any one of the first and second polishing sections 1001 and 1002 by the carrying device 1010, and the wafer W is then polished. The polished wafer W is carried into the wafer temporary-mounting table 1009 by the carrying device 1010. Then, the wafer W on the wafer temporary-mounting table 1009 is carried into the cleaning unit 1003 by the carrying device 1011, and the wafer W is then cleaned. Subsequently, the cleaned wafer W is carried into the dryer 1004 by the carrying device 1012, and dried within the dryer 1004. Then, the wafer W is carried into the FOUP 1005 by the carrying device 1013.

Next, the configuration of the bevel polishing apparatus 10 (the first and second polishing sections 1001 and 1002) will be described in detail.

FIG. 1 is a plan view illustrating the bevel polishing apparatus 10 according to the present exemplary embodiment. As illustrated in FIG. 1, the bevel polishing apparatus 10 according to the present exemplary embodiment is an apparatus for polishing the peripheral edge portion (the edge and the bevel) of a wafer W. The bevel polishing apparatus 10 includes: a housing 11; a wafer stage 23 configured to hold the wafer W within the housing 11; a bevel polishing unit 40 configured to polish the peripheral edge of the wafer W held on the wafer stage 23; and a substrate transfer apparatus 80 configured to mount the wafer W carried into the housing 11 on the wafer stage 23, and lift the wafer W held on the wafer stage 23 from the wafer stage 23.

The bevel polishing unit 40 polishes the peripheral edge portion of the wafer W held on the wafer stage 23. In the illustrated example, four (4) bevel polishing units 40 are installed within the housing 11. However, without being limited thereto, two (2), three (3), five (5), or more bevel polishing units 40 may be provided.

As illustrated in FIG. 1, the housing 11 includes an opening 12 on a lateral side thereof. The opening 12 is opened/closed by a shutter 13 driven by a cylinder (not illustrated). The carry-in/out of the wafer W with respect to the housing 11 is performed by a wafer carrying unit such as, for example, a carrying robot of the carrying device 1010 (see, e.g., FIG. 7). For example, as illustrated in FIG. 7, when the wafer W is carried into the first polishing section 1001, the wafer W on the wafer temporary-mounting table 1008 is placed on the carrying robot hands of the carrying device 1010. Subsequently, as illustrated in FIG. 1, the opening 12 of the housing 11 is opened by the shutter 13, the wafer W is delivered from the carrying robot hands of the carrying device 1010 to the hands 811 and 812 of the substrate transfer apparatus 80, then the wafer W is placed on the wafer stage 23 from the substrate transfer apparatus 80, and the opening 12 of the housing 11 is closed after the retreat of the carrying device 1010. In addition, for example, when the wafer W is carried out after the polishing of the bevel portion of the wafer W is terminated in the first polishing section 1001, the wafer W is placed on the hands 811 and 812 of the substrate transfer apparatus 80, and the opening 12 of the housing 11 is opened by the shutter 13. Subsequently, after the wafer W on the hands 811 and 812 of the substrate transfer apparatus 80 is placed on the carrying robot hands of the carrying device 1010, the wafer W is carried out from the housing 11 to be placed on the wafer temporary-mounting table 1009 by the carrying device 1010, and the opening 12 of the housing 11 is closed by the shutter 13. Meanwhile, when the opening 12 of the housing 11 is closed by the shutter 13, the inside of the housing 11 is blocked from the outside. Thereby, the cleanliness and airtightness within the housing 11 are maintained during the polishing, and as a result, the contamination of the wafer W from the outside of the housing 11 or the contamination of the outside of the housing 11 by the scattering of, for example, polishing liquid or particles from the inside of the housing 11 is suppressed.

Next, a configuration of the substrate transfer apparatus 80 according to the present exemplary embodiment will be described.

Figure 2:
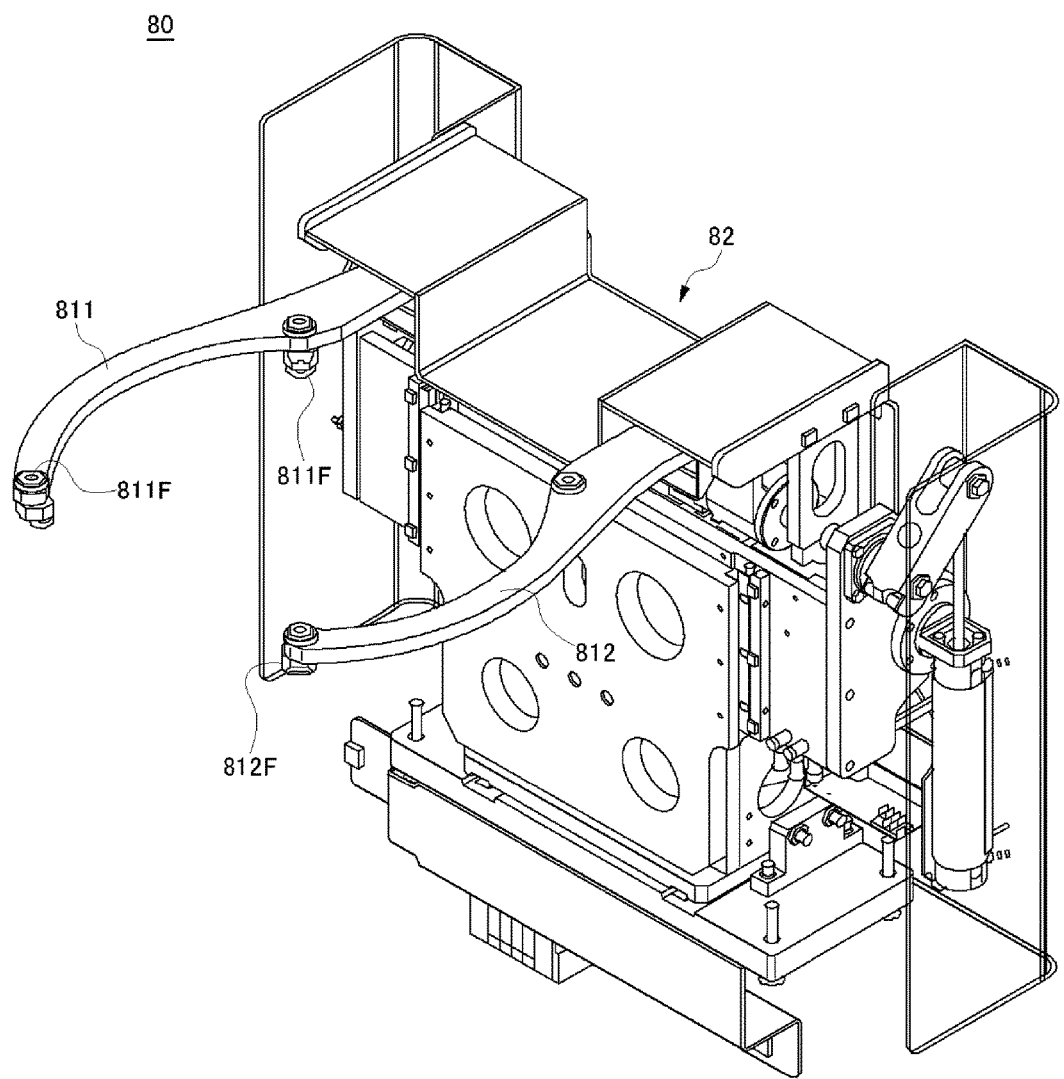
FIG. 2 is a perspective view illustrating a substrate transfer apparatus of the bevel polishing apparatus illustrated in FIG. 1.
Figure 3A:
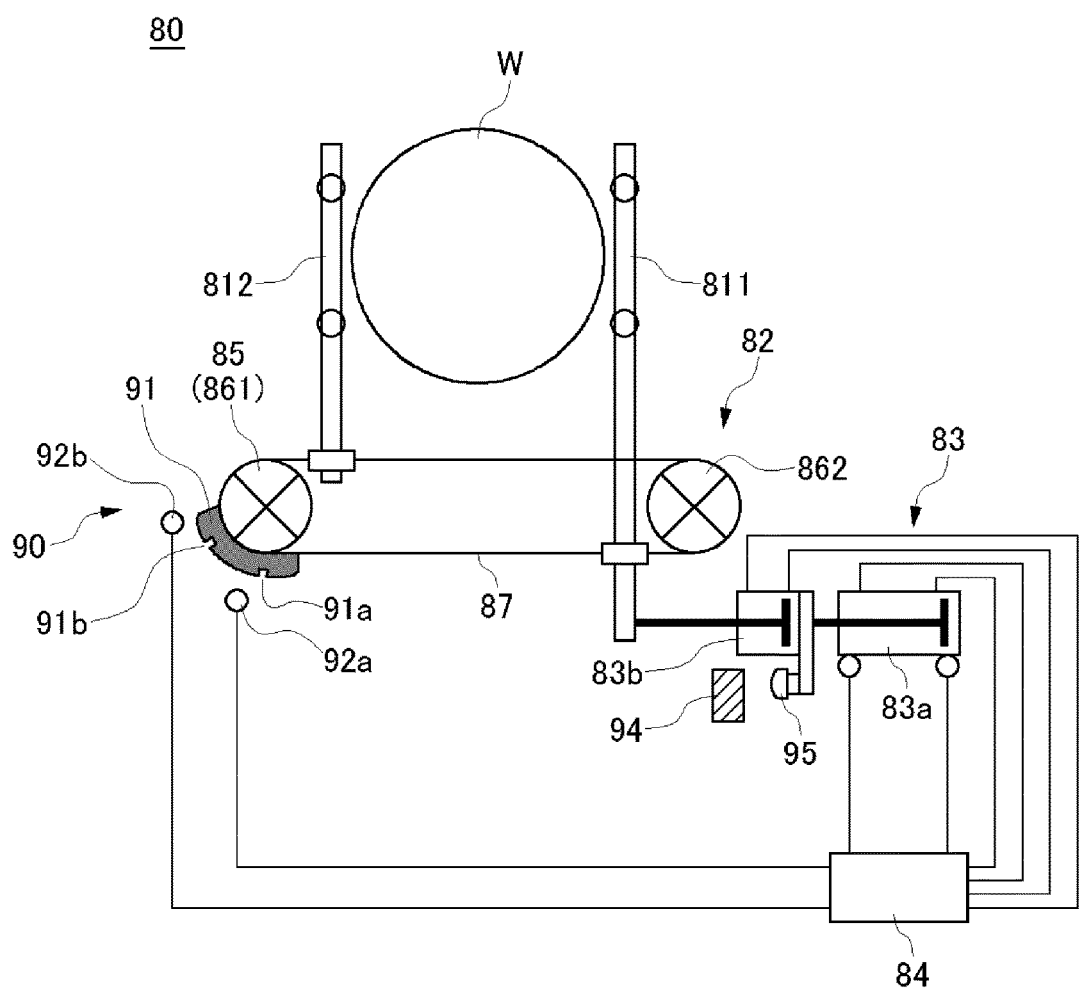
FIG. 3A is a schematic diagram of the substrate transfer apparatus illustrated in FIG. 2 in which the hands are illustrated in a state of being positioned at a hand-open position.
Figure 3B:
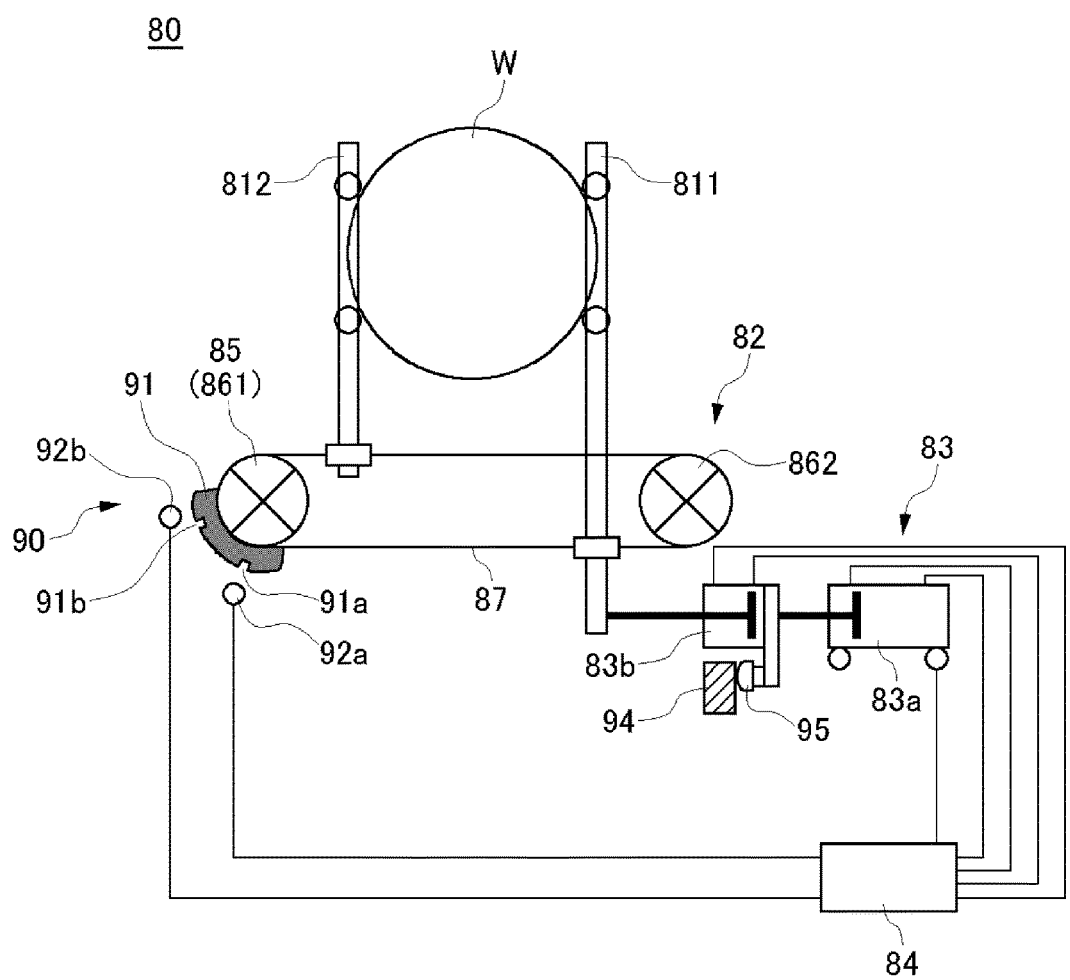
FIG. 3B is a schematic diagram illustrating the substrate transfer apparatus illustrated in FIG. 2 in which the hands are illustrated in a state of being positioned at a wafer receiving position.
Figure 3C:
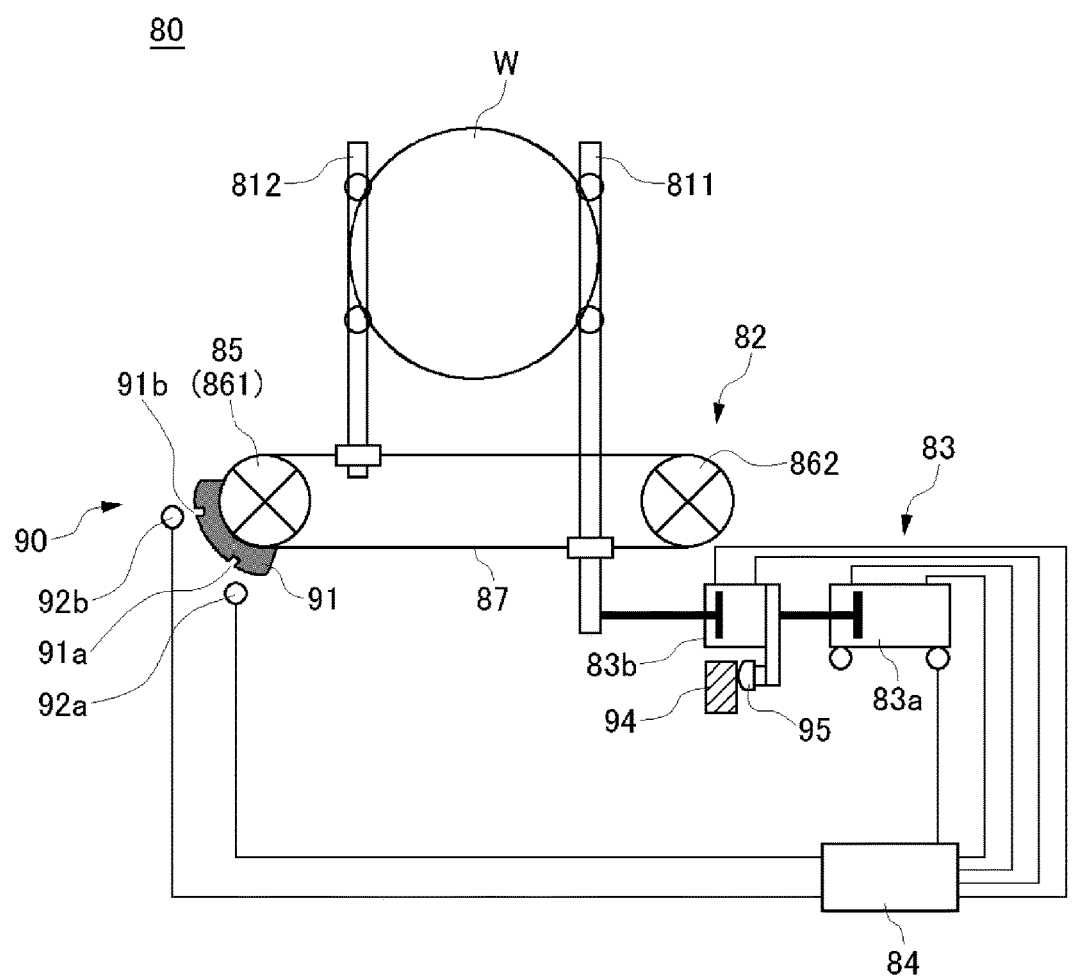
FIG. 3C is a schematic diagram of the substrate transfer apparatus illustrated in FIG. 2 in which the hands are illustrated in a state of being positioned at a wafer clamping position.
Figure 4A:
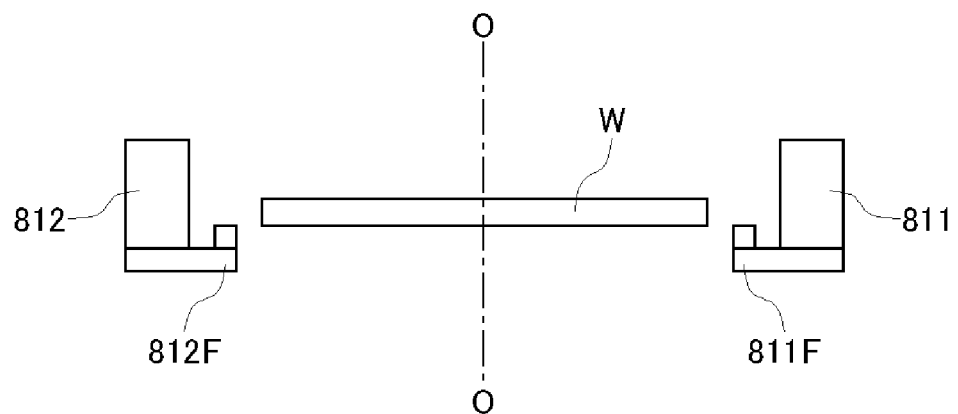
FIG. 4A is a view corresponding to FIG. 3A for describing a positional relationship between the hands and a wafer.
Figure 4B:
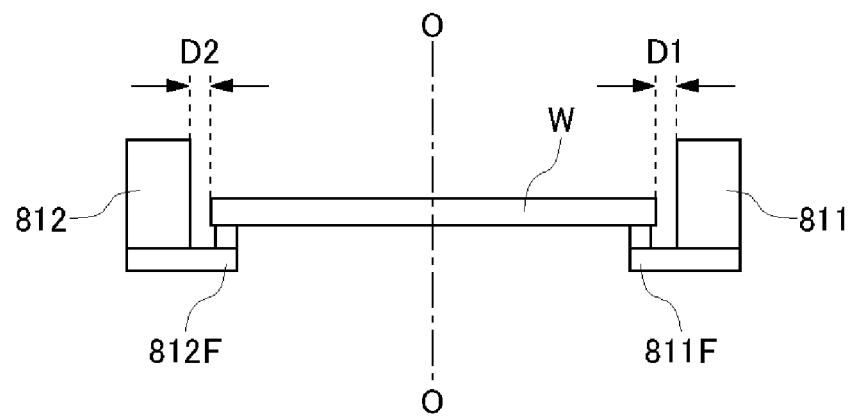
FIG. 4B is a view corresponding to FIG. 3B for describing a positional relationship between the hands and a wafer.
Figure 4C:
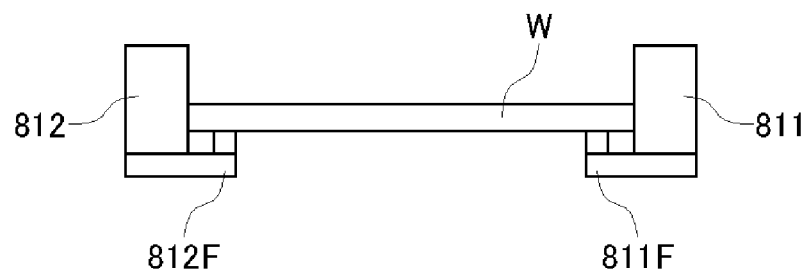
FIG. 4C is a view corresponding to FIG. 3C for describing a positional relationship between the hands and a wafer.

FIG. 2 is a perspective view illustrating the substrate transfer apparatus 80 of the present exemplary embodiment in an enlarged scale. FIGS. 3A to 3C are schematic diagrams of the substrate transfer apparatus illustrated in FIG. 2, each illustrating a state in which the hands are positioned at a hand-open position, a state in which the hands are positioned at a wafer receiving position (first position), and a state in which the hands are positioned at a wafer clamping position (second position), respectively. In addition, FIGS. 4A to 4C are views for describing a positional relationship between the hands and a wafer, in which FIGS. 4A to 4C correspond to FIGS. 3A to 3C, respectively.

As illustrated in FIG. 2 and FIGS. 3A to 3C, the substrate transfer apparatus 80 includes a pair of hands 811 and 812 facing each other, an opening/closing mechanism 82 configured to move the pair of hands 811 and 812 in such a manner in which the pair of hands 811 and 812 symmetrically move toward or away from each other in the opening/closing direction (in the left and right direction in FIGS. 3A to 3C), a driving unit 83 configured to transmit power to the opening/closing mechanism 82, and a controller 84 configured to control the operation of the driving unit 83.

The pair of hands 811 and 812 have fingers 811F and 812F installed to protrude in opposite directions, respectively. As illustrated in FIGS. 4B and 4C, the wafer W is placed on and supported by the fingers 811F and 812F of the pair of hands 811 and 812 in the wafer receiving position (first position) and the wafer clamping position (second position). Meanwhile, in the wafer clamping position (second position), each of the pair of hands 811 and 812 is in contact with the peripheral edge of the wafer W, and the wafer W is inserted to be sandwiched between the pair of hands 811 and 812 in the hand opening/closing direction. This causes the center of the wafer W to be positioned (centered) on the center line O-O of the pair of hands 811 and 812. In addition, in the wafer receiving position (first position), very small gaps D1 and D2 are formed between the pair of hands 811 and 812 and the peripheral edge of the wafer W. The size of the gaps D1 and D2 is, for example, 1 mm or less. This enables the transfer of the wafer W to be performed without applying stress to the wafer W while the transfer of the wafer W is performed between the robot and the pair of hands 811 and 812.

In the illustrated example, the opening/closing mechanism 82 includes a pair of gears 861 and 862 and an annular belt 87 wound around the pair of gears 861 and 862. The annular belt 87 extends to form two parallel linear portions between the pair of gears 861 and 862. Because the annular belt 87 fits in the state of being engaged with the pair of gears 861 and 862 by the tension thereof, it is easy to manage the high positional precision as compared to a case where the opening/closing mechanism 82 is constituted only with a rigid body.

As illustrated in FIGS. 3A to 3C, the base end of one hand 811 is attached to one linear portion (lower linear portion) of the annular belt 87, and the base end of the other hand 812 is attached to the other linear portion (upper linear portion) of the annular belt 87. Thus, when the one hand 811 moves leftward, the annular belt 87 rotates clockwise, which causes the other hand 812 to move rightward by the same moving amount as that of the one hand 811. As a result, the pair of hands 811 and 812 move symmetrically toward each other with reference to the center line O-O therebetween. In addition, when the one hand 811 moves rightward, the annular belt 87 rotates counterclockwise, which causes the other hand 812 to move leftward by the same moving amount as that of the one hand 811. As a result, the pair of hands 811 and 812 move symmetrically away from each other with reference to the center line O-O therebetween.

In the present exemplary embodiment, the driving unit 83 includes a first pneumatic actuator 83a and a second pneumatic actuator 83b that is smaller than the first pneumatic actuator 83a. The front end of the piston portion of the first pneumatic actuator 83a is fixed to the base end of the cylinder portion of the second pneumatic actuator 83b. In addition, the front end of the piston portion of the second pneumatic actuator 83b is fixed to the base end of the one hand 811.

When the piston portion of the first pneumatic actuator 83a extends when the pair of hands 811 and 812 are positioned in the hand-open position as illustrated in FIGS. 3A and 4A, the second pneumatic actuator 83b and the one hand 811 move leftward in unison, which causes the other hand 812 to move rightward. Consequently, the pair of hands 811 and 812 move to the wafer receiving position (first position) as illustrated in FIGS. 3B and 4B. Subsequently, when the piston portion of the second pneumatic actuator 83b extends, the one hand 811 moves leftward, which causes the other hand 812 to move rightward. Consequently, the pair of hands 811 and 812 move to the wafer clamping position (second position) as illustrated in FIGS. 3C and 4C.

Next, when the piston portion of the second pneumatic actuator 83b contracts, the one hand 811 moves rightward, which causes the other hand 812 to move leftward. Consequently, the pair of hands 811 and 812 move back to the wafer receiving position (first position) as illustrated in FIGS. 3B and 4B. Subsequently, when the piston portion of the first pneumatic actuator 83a contracts, the second pneumatic actuator 83b and the one hand 811 move rightward in unison, which causes the other hand 812 to move leftward. Consequently, the pair of hands 811 and 812 are returned to the hand-open position as illustrated in FIGS. 3A and 4A.

Meanwhile, the driving unit 83 is not limited to the aspect in which the pneumatic actuators 83a, 83b are used, as long as the driving unit 83 is capable of delivering the power of moving the pair of hands 811 and 812 from the hand-open position to the wafer clamping position (second position) via the wafer receiving position (first position), to the opening/closing mechanism 82. The pneumatic actuators 83a, 83b may be used such that the clamping pressure applied to the wafer W in the wafer clamping position (second position) are properly adjusted. In a case where a motor is used, a motor capable of controlling a torque may be used in such a manner in which an excessive clamping pressure is not applied to the wafer W in the wafer clamping position (second position).

As illustrated in FIGS. 3A to 3C, the opening/closing mechanism 82 includes a rotating body 85 configured to rotate according to the moving amount of the pair of hands 811 and 812 in the opening/closing direction, and a sensor 90 configured to detect the rotation amount of the rotating body 85. Thus, the moving amount of the pair of hands 811 and 812 in the opening/closing direction is converted into and detected as the rotation amount (rotation angle) of the rotating body 85, which enables a moving amount from the wafer receiving position to the wafer clamping position to be precisely detected even if the moving amount is very small.

In the illustrated example, the rotating body 85 is constituted with one gear 861. Thus, it is not necessary to add a new component as the rotating body 85, and thus the opening/closing mechanism 82 is simple in configuration and thus inexpensive.

Figure 6:
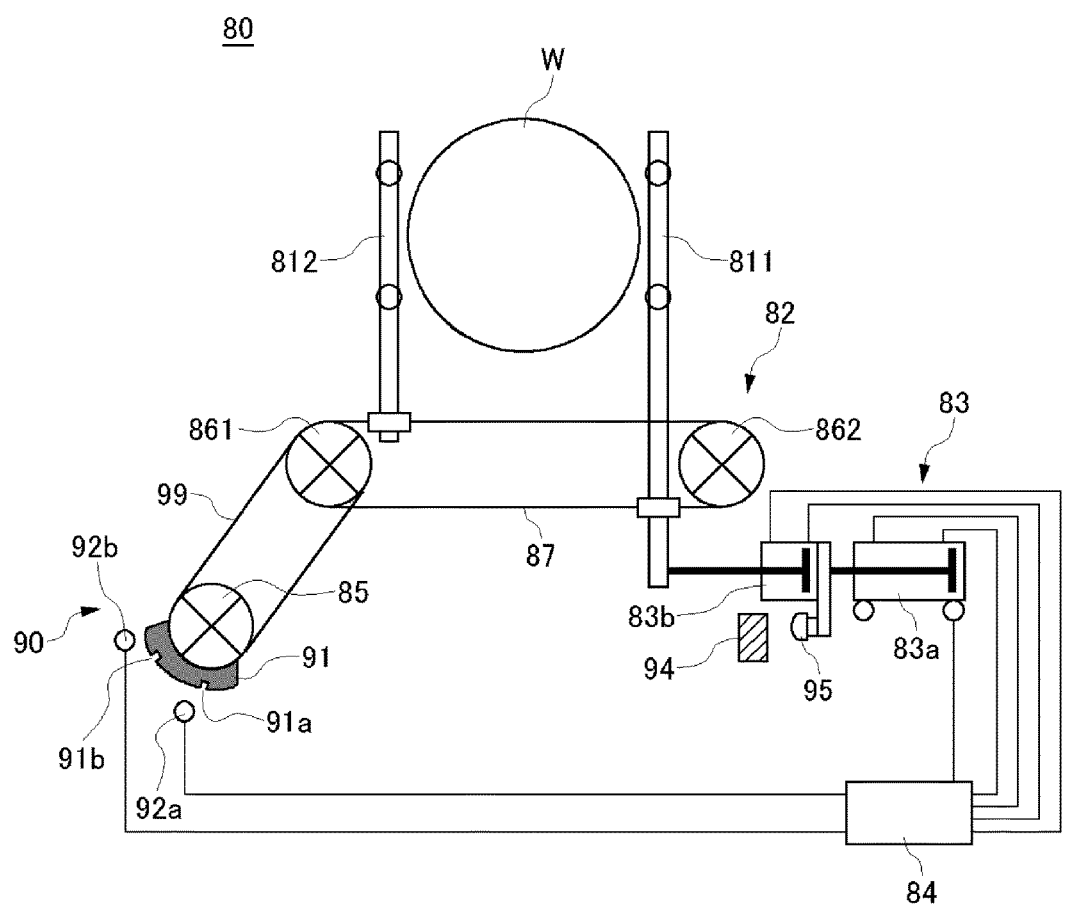
FIG. 6 is a schematic diagram for describing a modification of the substrate transfer apparatus illustrated in FIG. 2.

Meanwhile, as illustrated in FIG. 6, the rotating body 85 may be a component separate from the pair of gears 861 and 862. In the example illustrated in FIG. 6, an annular auxiliary belt 99 is wound on the rotating body 85 and the one gear 861, and the pair of gears 861 and 862 rotate depending on the moving amount of the pair of hands 811 and 812 in the opening/closing direction, and the rotating body 85 rotates according to the rotation amount of the one gear 861. According to this aspect, a sensor 90 to be described later may be easily installed even if the space around the gear 861 is narrow.

In the present exemplary embodiment, the sensor 90 is a dog-type sensor, and includes an arcuate dog 91 fixed to the rotating body 85, a first photo micro-sensor 92a, and a second photo micro-sensor 92b, in which the first and second photo micro-sensors 92a, 92b are disposed outside the dog 91.

As illustrated in FIGS. 3A to 3C, the arcuate dog 91 is formed with a first slit 91a and a second slit 91b. The first photo micro-sensor 92a is disposed at a position where the first photo micro-sensor 92a faces the first slit 91a to be turned ON when the pair of hands 811 and 812 are in the wafer receiving position (first position). In addition, the second photo micro-sensor 92b is disposed at a position where the second photo micro-sensor 92b faces the second slit 91b to be turned ON when the pair of hands 811 and 812 are in the wafer clamping position (second position). Thus, when the pair of hands 811 and 812 are in the wafer receiving position (first position), the first photo micro-sensor 92a is turned ON and the second photo micro-sensor 92b is turned OFF. In addition, when the pair of hands 811 and 812 are in the wafer clamping position (second position), the first photo micro-sensor 92a is turned OFF and the second photo micro-sensor 92b is turned ON. Accordingly, it is possible to determine whether the pair of hands 811 and 812 reach the wafer receiving position (first position) or the wafer clamping position (second position) based on signals from the first photo micro-sensor 92a and the second photo micro-sensor 92b.

The controller 84 controls the operation of the driving unit 83 based on a signal from the sensor 90 (the first photo micro-sensor 92a and the second photo micro-sensor 92b). In addition, the controller 84 determines whether the pair of hands 811 and 812 reach the wafer receiving position (first position) or the wafer clamping position (second position) based on the signal from the sensor 90. The controller 84 may be implemented by, for example, a computer system.

As described above, in the opening/closing operation of the pair of hands 811 and 812, the operating stroke from the wafer receiving position (first position) to the wafer clamping position (second position) is a very short distance (e.g., 1 mm or less). For that reason, the opening/closing operation of the pair of hands 811 and 812 may be easily affected by the rear surface of the wafer W such that a case in which the opening/closing operation of the pair of hands 811 and 812 is not smoothly performed may occur accidentally in such a manner in which, due to, for example, a friction on a contact surface, it takes a long time until the pair of hands 811 and 812 reach the wafer clamping position, or the pair of hands 811 and 812 are stopped on their way. Since this is an accidental error, it is very rare for the case to continuously occur a plurality of times. In the past, however, because an accidental error and a critical error requiring situation confirmation by an operator were not distinguishable from each other, it was required to stop the apparatus and perform the situation confirmation by the operator even in the case of an accidental error.

In order to solve the problem, in the present exemplary embodiment, as illustrated in FIG. 5, the controller 84 is configured to: control the operation of the driving unit 83 such that the pair of hands 811 and 812 move from the wafer receiving position (first position) to the wafer clamping position (second position); determine whether the pair of hands 811 and 812 reach the wafer clamping position (second position) based on a signal from the sensor 90; and when it is determined that the hands 811 and 812 do not reach the wafer clamping position (second position), repeat a retry operation of controlling the operation of the driving unit 83 such that the pair of hands 811 and 812 move from the wafer receiving position (first position) to the wafer clamping position (second position) after returning to the wafer receiving position (first position), by a predetermined number of times (e.g., three (3) times) as the upper limit until the pair of hands 811 and 812 reach the wafer clamping position (second position). In a case where the pair of hands 811 and 812 do not reach the wafer clamping position (second position) due to an accidental error, the error can be corrected by the retry operation. Thus, because it is not required to temporarily stop the apparatus, the operating rate of the apparatus is substantially improved.

Next, the operation of the substrate transfer apparatus 80 configured as described above will be described with reference to FIG. 5.

First, when a wafer W is received from the robot, the controller 84 controls the operation of the driving unit 83 based on a signal from the sensor 90 such that the pair of hands 811 and 812 move to the wafer receiving position (first position) (step S101). That is, as illustrated in FIG. 3B, in the state where the piston portion of the second pneumatic actuator 83b is contracted, the controller 84 causes the piston portion of the first pneumatic actuator 83a to be extended until the protrusion 95 formed on the base end of the second pneumatic actuator 83b comes in contact with a stopper 94. Thus, when the pair of hands 811 and 812 reach the wafer receiving position (first position), the first photo micro-sensor 92a is turned ON and the second photo micro-sensor 92b is turned OFF. Thereafter, the wafer W is transferred onto the pair of fingers 811F and 812F of the pair of hands 811 and 812 from the robot (the wafer W is prepared).

Next, in order to position the transferred wafer W to the central position (in order to perform centering), the controller 84 controls the operation of the driving unit 83 based on a signal from the sensor 90 such that the pair of hands 811 and 812 move to the wafer clamping position (second position) by approaching each other by the same distance (step S102). That is, as illustrated in FIG. 3C, in the state where the piston portion of the first pneumatic actuator 83a is extended, the controller 84 causes the piston portion of the second pneumatic actuator 83b to be extended.

Then, the controller 84 determines, based on a signal from the sensor 90, whether the hands 811 and 812 reach the wafer clamping position (second position) (step S103).

When it is determined in step S103 that the pair of hands 811 and 812 reach the wafer clamping position (second position), each of the pair of hands 811 and 812 is in contact with the peripheral edge of the wafer W, and the wafer W is sandwiched between the pair of hands 811 and 812. This causes the center of the wafer W to be positioned on the center line O-O of the pair of hands 811 and 812.

Meanwhile, when it is determined in step 103 that the pair of hands 811 and 812 do not reach the wafer clamping position (second position), the controller 84 increases the number of repetition times stored in a storage unit (not illustrated) by 1 (step S104). Then, the controller 84 determines whether the number of repetition times stored in the storage unit exceeds a predetermined maximum number of repetition times (e.g., three times) (step S105).

When it is determined in step S105 that the number of repetition times stored in the storage unit does not exceed the predetermined maximum number of repetition times, the process returns to step S101 and is performed again. That is, the controller 84 controls the operation of the driving unit 83 such that after being returned to the wafer receiving position (first position), the pair of hands 811 and 812 move toward each other by the same distance from the wafer receiving position (first position), thereby moving to the wafer clamping position (second position) (retry operation).

Meanwhile, when it is determined that the number of repetition times stored in the storage unit exceeds the predetermined maximum number of repetition times in step 5105, the controller 84 determines that a critical error occurs, stops the operation of the apparatus, and outputs an error message or an alarm sound, thereby urging the operator to confirm the situation.

As described above, according to the present exemplary embodiment, because the moving amount of the pair of hands 811 and 812 in the opening/closing direction is converted into and detected as the rotation amount (rotation angle) of the rotating body 85, the moving amount can be precisely detected even if the moving amount is very small This enables to cope with a movement at a very small stroke of the pair of hands 811 and 812 such that even if there is a change in a wafer diameter, the center of the wafer W may be precisely positioned at the axial center of the stage.

In addition, according to the present exemplary embodiment, the opening/closing mechanism 82 includes a pair of gears 861 and 862 and an annular belt 87 wound around the pair of gears 861 and 862. One hand 811 is attached to one linear portion of the annular belt 87, and the other hand 812 is attached to the other linear portion of the annular belt 87. In this case, because the annular belt 87 fits in the state of being engaged with the pair of gears 861 and 862 by the tension thereof, the high positional precision may be easily managed as compared to a case where the opening/closing mechanism 82 is constituted only with a rigid body.

In addition, according to the present exemplary embodiment, because the rotating body 85 is constituted with the one gear 861, the number of components is reduced and the opening/closing mechanism 82 becomes inexpensive.

In addition, according to the present exemplary embodiment, because the driving unit 83 includes the pneumatic actuators 83a and 83b, the clamping pressure is easily adjusted during the clamping of a wafer, and the driving unit becomes inexpensive.

In addition, according to present exemplary embodiment, the controller 84 is configured to: control the operation of the driving unit 83 such that the pair of hands 811 and 812 move from the wafer receiving position (first position) to the wafer clamping position (second position); determine, based on a signal from the sensor 90, whether the pair of hands 811 and 812 reach the wafer clamping position; and when it is determined that the pair of hands 811 and 812 do not reach the wafer clamping position (second position), repeat a retry operation of controlling the operation of the driving unit 83 such that the pair of hand 811 and 812 move from the wafer receiving position (first position) to the wafer clamping position (second position) after returning to the wafer receiving position (first position), by a predetermined number of times. Thus, even if an accidental error occurs during the clamping, it is possible to correct the error by the retry operation. Because this reduces the number of times of stopping the substrate transfer apparatus 80, the operating rate of the apparatus is substantially improved.

In addition, according to the present exemplary embodiment, because the sensor 90 is a dog type sensor, the sensor 90 has a simple structure and becomes inexpensive.

Meanwhile, while the controller 84 of the substrate transfer apparatus 80 of the present exemplary embodiment may be implemented by a computer system, a program for implementing the controller 84 of the substrate transfer apparatus 80 in a computer system and a record medium recorded with the program are also objects to be protected by this application.

From the foregoing, it will be appreciated that various exemplary embodiments of the present disclosure have been described herein for the purpose of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate transfer apparatus comprising:
a pair of hands facing each other;
an opening/closing mechanism configured to move the pair of hands symmetrically toward or away from each other in an opening/closing direction;
a driving unit configured to transmit a power to the opening/closing mechanism, the driving unit including a first actuator of which a front end of a piston portion is fixed to a base end of one of the pair of hands and a second actuator of which a front end of a piston portion is fixed to a base end of a cylinder portion of the first actuator; and
a controller configured to control an operation of the driving unit,
wherein the opening/closing mechanism includes:
a rotating body configured to rotate depending on a moving amount of the pair of hands in the opening/closing direction, and
sensor configured to detect a rotating amount of the rotating body, and
wherein the controller controls the operation of the driving unit based on a signal from the sensor.

2. The substrate transfer apparatus of claim 1, wherein the opening/closing mechanism includes a pair of gears and an annular belt wound around the pair of gears,
the annular belt extends to form two parallel linear portions between the pair of gears, and
one of the pair of hands is attached to one of the linear portions of the annular belt, and the other of the pair of hands is attached to the other of the linear portion of the annular belt.

3. The substrate transfer apparatus of claim 2, wherein the rotating body is constituted with one of the pair of gears.

4. The substrate transfer apparatus of claim 2, wherein the rotating body is a separate component from the pair of gears.

5. The substrate transfer apparatus of claim 2, wherein the sensor is attached to one of the pair of gears.

6. The substrate transfer apparatus of claim 1, wherein each of the first actuator and the second actuator is a pneumatic actuator.

7. The substrate transfer apparatus of claim 1, wherein the controller is configured to: control the operation of the driving unit such that the pair of hands move from a wafer receiving position to a wafer clamping position; determine whether the pair of hands reach the wafer clamping position based on the signal from the sensor; and, when it is determined that the pair of hands do not reach the wafer clamping position, repeat a retry operation of controlling the operation of the driving unit such that the pair of hands move from the wafer receiving position to the wafer clamping position after returning to the wafer receiving position, by a predetermined number of times as an upper limit until the pair of hands reach the wafer clamping position.

8. The substrate transfer apparatus of claim 1, wherein the sensor is a dog type sensor.

9. The substrate transfer apparatus of claim 1, wherein the first actuator is smaller than the second actuator.

10. The substrate transfer apparatus of claim 1, wherein a protrusion is formed on a base end of the first actuator, and
the substrate transfer apparatus further includes a stopper having a contact surface in a contact with the protrusion of the first actuator.

11. A substrate transfer apparatus comprising:
a pair of hands facing each other;
an opening/closing mechanism configured to move the pair of hands toward or away from each other by a same distance in an opening/closing direction, the opening/closing mechanism including a rotating body configured to rotate depending on a moving amount of the pair of hands in the opening/closing direction;
a sensor configured to detect a rotating amount of the rotating body;
a driving unit configured to transmit a power to the opening/closing mechanism, the driving unit including a first actuator of which a front end of a piston portion is fixed to a base end of one of the pair of hands and a second actuator of which a front end of a piston portion is fixed to a base end of a cylinder portion of the first actuator; and
a controller configured to: control an operation of the driving unit based on a signal from the sensor, such that the pair of hands move from a wafer receiving position to a wafer clamping position when receiving a substrate; determine whether the pair of hands reach the wafer clamping position; and when it is determined that the pair of hands do not reach the wafer clamping position, control the operation of the driving unit to repeat a retry operation by a predetermined number of times as an upper limit until the pair of hands reach the wafer clamping position.

12. The substrate transfer apparatus of claim 11, wherein the first actuator is smaller than the second actuator.

13. The substrate transfer apparatus of claim 11, wherein a protrusion is formed on a base end of the first actuator, and
the substrate transfer apparatus further includes a stopper having a contact surface in a contact with the protrusion of the first actuator.

14. A semiconductor device manufacturing apparatus comprising a substrate transfer apparatus including:
a pair of hands facing each other;
an opening/closing mechanism configured to move the pair of hands symmetrically toward or away from each other in an opening/closing direction;
a driving unit configured to transmit a power to the opening/closing mechanism, the driving unit including a first actuator of which a front end of a piston portion is fixed to a base end of one of the pair of hands and a second actuator of which a front end of a piston portion is fixed to a base end of a cylinder portion of the first actuator; and
a controller configured to control an operation of the driving unit,
wherein the opening/closing mechanism includes:
a rotating body configured to rotate depending on a moving amount of the pair of hands in the opening/closing direction, and
a sensor configured to detect a rotating amount of the rotating body, and
wherein the controller controls the operation of the driving unit based on a signal from the sensor.

15. A bevel polishing apparatus comprising a substrate transfer apparatus including:
a pair of hands facing each other;
an opening/closing mechanism configured to move the pair of hands symmetrically toward or away from each other in an opening/closing direction;
a driving unit configured to transmit a power to the opening/closing mechanism, the driving unit including a first actuator of which a front end of a piston portion is fixed to a base end of one of the pair of hands and a second actuator of which a front end of a piston portion is fixed to a base end of a cylinder portion of the first actuator; and
a controller configured to control an operation of the driving unit,
wherein the opening/closing mechanism includes:
a rotating body configured to rotate depending on a moving amount of the pair of hands in the opening/closing direction, and
a sensor configured to detect a rotating amount of the rotating body, and
wherein the controller controls the operation of the driving unit based on a signal from the sensor.

16. A substrate transfer method using a pair of hands of a substrate transfer apparatus, the substrate transfer method comprising:
providing an actuator formed with a protrusion and configured to drive the pair of hands;
providing a controller configured to control an operation of the actuator;
moving the pair of hands to a first position until the protrusion of the actuator comes into a contact with a stopper provided in the substrate transfer apparatus;
providing a rotating body configured to rotate depending on a moving amount of the pair of hands;
providing a sensor configured to detect a rotating amount of the rotating body;
providing a substrate on the pair of hands disposed at the first position;
causing the pair of hands, which is located at the first position and faces each other, to move toward each other from opposite sides of the substrate by a same distance;
determining whether the pair of hands reach a second position to grasp the substrate based on a signal from the sensor that determines the moving amount of the pair of hands by measuring the rotating amount of the rotating body, wherein the signal from the sensor is provided to the controller;
when it is determined by the controller, based upon the signal from the sensor, that the pair of hands do not reach the second position to grasp the substrate, performing a retry operation of returning the pair of hands to the first position and then determining, based on the signal from the sensor that measures the rotating amount of the rotating body, whether the pair of hands reach the second position to grasp the substrate while causing the pair of hands to move toward each other by a same distance;

repeating the retry operation until it is determined that the pair of hands reach the second position to grasp the substrate by the retry operation, or until a number of times of performing the retry operation reaches a predetermined number of times; and when it is determined that the pair of hands reach the second position to grasp the substrate, transferring the substrate to a subsequent stage.

17. A bevel polishing method using a bevel polishing apparatus that includes a substrate transfer apparatus including a pair of hands, the bevel polishing method comprising:

providing an actuator formed with a protrusion and configured to drive the pair of hands;

providing a controller configured to control an operation of the actuator;

moving the pair of hands to a first position until the protrusion of the actuator comes into a contact with a stopper provided in the substrate transfer apparatus;

providing a rotating body configured to rotate depending on a moving amount of the pair of hands;

providing a sensor configured to detect a rotating amount of the rotating body;

providing a substrate on the pair of hands disposed at the first position;

causing the pair of hands, which is located at the first position and faces each other, to move toward each other from opposite sides of the substrate by a same distance;

determining whether the pair of hands reach a second position to grasp the substrate based on a signal from the sensor that determines the moving amount of the pair of hands by measuring the rotating amount of the rotating body, wherein the signal from the sensor is provided to the controller;

when it is determined by the controller, based upon the signal from the sensor, that the pair of hands do not reach the second position to grasp the substrate, performing a retry operation of returning the pair of hands to the first position and then determining, based on the signal from the sensor that measures the rotating amount of the rotating body, whether the pair of hands reach the second position to grasp the substrate while causing the pair of hands to move toward each other by a same distance;

repeating the retry operation until it is determined that the pair of hands reach the second position to grasp the substrate by the retry operation, or until a number of times of performing the retry operation reaches a predetermined number of times;

when it is determined that the pair of hands reach the second position to grasp the substrate, transferring a substrate from a substrate transfer apparatus to a wafer stage;

polishing a bevel portion of the substrate;

delivering the polished substrate on the wafer stage to a carrying device through the substrate transfer apparatus; and cleaning the substrate carried to a cleaning unit by the carrying device.

18. A non-transitory computer-readable recording medium storing a computer executable program that causes a computer to control a substrate transfer method with a substrate transfer apparatus that includes a pair of hands, the substrate transfer method comprising:

providing an actuator formed with a protrusion and configured to drive the pair of hands;

providing a controller configured to control an operation of the actuator;

moving the pair of hands to a first position until the protrusion of the actuator comes into a contact with a stopper provided in the substrate transfer apparatus;

providing a rotating body configured to rotate depending on a moving amount of the pair of hands;

providing a sensor configured to detect a rotating amount of the rotating body;

providing a substrate on the pair of hands disposed at the first position;

causing the pair of hands, which is located at the first position and faces with each other, to move toward each other from opposite sides of the substrate by a same distance;

determining whether the pair of hands reach a second position to grasp the substrate based on a signal from the sensor that determines the moving amount of the pair of hands by measuring the rotating amount of the rotating body, wherein the signal from the sensor is provided to the controller;

when it is determined by the controller, based upon the signal from the sensor, that the pair of hands do not reach the second position to grasp the substrate, performing a retry operation of returning the pair of hands to the first position and then determining, based on the signal from the sensor that measures the rotating amount of the rotating body, whether the pair of hands reach the second position to grasp the substrate while causing the pair of hands to move toward each other by a same distance;

repeating the retry operation until it is determined that the pair of hands reach the second position to grasp the substrate by the retry operation, or until a number of times of performing the retry operation reaches a predetermined number of times; and when it is determined that the pair of hands reach the second position to grasp the substrate, transferring the substrate to a subsequent stage.

* * * * *